United States Patent
Han et al.

(10) Patent No.: US 11,404,301 B2
(45) Date of Patent: Aug. 2, 2022

(54) DICING DIE-BONDING FILM

(71) Applicant: LG CHEM, LTD., Seoul (KR)

(72) Inventors: Ji Ho Han, Daejeon (KR); Se Ra Kim, Daejeon (KR); Mun Seop Song, Daejeon (KR); Kwang Joo Lee, Daejeon (KR); Yeong Im Yu, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 16/626,102

(22) PCT Filed: Aug. 30, 2018

(86) PCT No.: PCT/KR2018/010079
§ 371 (c)(1),
(2) Date: Dec. 23, 2019

(87) PCT Pub. No.: WO2019/117428
PCT Pub. Date: Jun. 20, 2019

(65) Prior Publication Data
US 2020/0211889 A1     Jul. 2, 2020

(30) Foreign Application Priority Data

Dec. 14, 2017  (KR) ................ 10-2017-0172472
Jul. 12, 2018  (KR) ................ 10-2018-0081251

(51) Int. Cl.
*H01L 21/683*     (2006.01)
*H01L 21/78*      (2006.01)

(52) U.S. Cl.
CPC .......... *H01L 21/6836* (2013.01); *H01L 21/78* (2013.01)

(58) Field of Classification Search
None
See application file for complete search history.

(56) References Cited

U.S. PATENT DOCUMENTS

| | | | |
|---|---|---|---|
| 8,025,968 B2* | 9/2011 | Yamamoto .......... | H01L 21/6836 428/521 |
| 2011/0014443 A1 | 1/2011 | Kokoi et al. | |
| 2013/0330910 A1* | 12/2013 | Tanaka .................... | H01L 24/27 428/138 |
| 2014/0162434 A1* | 6/2014 | Shiga .................... | H01L 23/544 438/464 |
| 2015/0303093 A1 | 10/2015 | Fujimoto | |
| 2016/0368177 A1 | 12/2016 | Kasai et al. | |
| 2017/0239923 A1 | 8/2017 | Fuse et al. | |
| 2017/0323820 A1 | 11/2017 | Tamura et al. | |
| 2019/0088528 A1 | 3/2019 | Kurihara et al. | |

FOREIGN PATENT DOCUMENTS

| | | |
|---|---|---|
| CN | 103140917 A | 6/2013 |
| CN | 103865146 A | 6/2014 |
| CN | 106794684 A | 5/2017 |
| CN | 107078042 A | 8/2017 |
| JP | H10-183090 A | 7/1998 |
| JP | 2001-152106 A | 6/2001 |
| JP | 2007-009135 A | 1/2007 |
| JP | 2007-043070 A | 2/2007 |
| JP | 2011-210944 A | 10/2011 |
| JP | 2011-210989 A | 10/2011 |
| JP | 2011-233632 A | 11/2011 |
| JP | 2014-133858 A | 7/2014 |
| KR | 10-2006-0085042 A | 7/2006 |
| KR | 10-2007-0119182 A | 12/2007 |
| KR | 10-2007-0119584 A | 12/2007 |
| KR | 10-2010-0137456 A | 12/2010 |
| KR | 10-1002033 B1 | 12/2010 |
| KR | 10-1010418 B1 | 1/2011 |
| KR | 10-2013-0116261 A | 10/2013 |
| KR | 10-2014-0038858 A | 3/2014 |
| KR | 10-2014-0074816 A | 6/2014 |
| KR | 10-2014-0127760 A | 11/2014 |
| KR | 10-1635265 B1 | 7/2016 |
| KR | 10-2016-0130804 A | 11/2016 |
| KR | 10-2016-0140456 A | 12/2016 |
| KR | 10-1733081 B1 | 5/2017 |
| TW | M423986 U1 | 3/2012 |
| TW | 201430095 A | 8/2014 |
| WO | 2014-069638 A1 | 5/2014 |
| WO | 2016-068042 A1 | 5/2016 |
| WO | 2017-169959 A1 | 10/2017 |

OTHER PUBLICATIONS

English translation of "KR1020070119182 Antistatic Dicing Tape" (Year: 2007).*
International Search Report and Written Opinion issued for PCT/KR2018/010079 dated Mar. 13, 2019, 8 pages.
Min Gi Hong et al., "Preparation of Antistatic Coating Solutions by Blending Aniline Terminated Waterborne Polyurethane with PEDOT/PSS", Korean Chemical Engineering Research, vol. 50, No. 4, Aug. 2012, pp. 614-620.

\* cited by examiner

*Primary Examiner* — Khaja Ahmad
(74) *Attorney, Agent, or Firm* — Rothwell, Figg, Ernst & Manbeck, P.C.

(57) ABSTRACT

The present invention relates to a dicing die-bonding film including: a substrate; an antistatic layer formed on the substrate and including an aliphatic or alicyclic polyurethane resin and a conductive filler; a cohesive layer formed on the antistatic layer; and an adhesive layer formed on the cohesive layer, and a dicing method of a semiconductor wafer using the dicing die-bonding film.

8 Claims, No Drawings

DICING DIE-BONDING FILM

CROSS-REFERENCE TO RELATED APPLICATION(S)

This application is a 35 U.S.C. § 371 National Phase Entry Application from PCT/KR2018/010079, filed on Aug. 30, 2018, and designating the United States, claims the benefits of filing dates of Korean Patent Application No. 10-2017-0172472 filed with the Korean Intellectual Property Office on Dec. 14, 2017 and Korean Patent Application No. 10-2018-0081251 filed with the Korean Intellectual Property Office on Jul. 12, 2018, the entire contents of which are incorporated herein by reference.

TECHNICAL FIELD

The present invention relates to a dicing die-bonding film, and more specifically, to a dicing die-bonding film capable of imparting antistatic performance and reducing the occurrence of static electricity generated during a semiconductor packaging process, thereby improving the reliability of a package and preventing damage to a semiconductor device, and a dicing method of a semiconductor wafer using the dicing die-bonding film.

BACKGROUND ART

In general, a process for manufacturing a semiconductor chip includes a process of forming fine patterns on a wafer and a process of polishing the wafer and packaging the polished wafer so as to meet standards of a final device.

The packaging process includes: a wafer inspection process which inspects for defects of the semiconductor chip; a dicing process which cuts the wafer to make separated individual chips; a die-bonding process which attaches the separated chips to a mounting plate of a circuit film or a lead frame; a wire bonding process which connects a chip pad provided on the semiconductor chip and circuit patterns of the circuit film or the lead frame via an electrical connector such as a wire; a molding process which encloses an outer portion with an encapsulant so as to protect inner circuits of the semiconductor chip and other components; a trim process which cuts a dambar connecting leads; a forming process which bends the leads to have a desired shape; a finished product inspection process which inspects defects of a finished package; and the like.

Through the dicing process, individual chips which are separated from each other are manufactured from the semiconductor wafer in which a plurality of chips are formed.

In a broad sense, the dicing process is a process of grinding a rear surface of the semiconductor wafer and cutting the semiconductor wafer along dicing lines among the chips to manufacture the plurality of individual chips which are separated from each other.

However, since all the components of the dicing die-bonding film are composed of an insulator, a considerable amount of static electricity is generated in the process prior to laminating the wafer, the individual chip producing process of the die bond layer and chips, and the separation of the dicing film and the die bonding layer. Consequently, there is a high possibility of various problems occurring due to static electricity, for example, a circuit formed on a semiconductor wafer may be destroyed, or materials may be adsorbed on a circuit such that the circuit is contaminated. When these problems occur, the reliability of a final product is lowered and the yield of the product is reduced.

DETAILED DESCRIPTION OF THE INVENTION

The present invention provides a dicing die-bonding film capable of imparting antistatic performance and reducing the occurrence of static electricity generated during a semiconductor packaging process, thereby improving the reliability of a package and preventing damage to a semiconductor device, and a dicing method of a semiconductor wafer using the dicing die-bonding film.

The present invention provides a dicing die-bonding film including: a substrate; an antistatic layer formed on the substrate and including an aliphatic or alicyclic polyurethane resin and a conductive filler; a cohesive layer formed on the antistatic layer; and an adhesive layer formed on the cohesive layer.

The present invention also provides a dicing method of a semiconductor wafer using the dicing die-bonding film.

Hereinafter, a dicing die-bonding film and a dicing method of a semiconductor wafer according to specific embodiments of the present invention will be described in more detail.

According to one embodiment of the present invention, a dicing die-bonding film including: a substrate; an antistatic layer formed on the substrate and including an aliphatic or alicyclic polyurethane resin and a conductive filler; a cohesive layer formed on the antistatic layer; and an adhesive layer formed on the cohesive layer, can be provided.

The present inventors conducted research on a method of improving a pick-up property and preventing damage to a thin semiconductor chip, and found through experiments that while an antistatic layer containing an aliphatic or alicyclic polyurethane resin and a conductive filler is formed on a substrate, not only does it not affect existing semiconductor manufacturing processes, but also reliability prevents defects due to static electricity by imparting antistatic performance, thereby completing the present invention.

As described above, the antistatic layer may include an aliphatic or alicyclic polyurethane resin and a conductive filler. Here, as the antistatic layer includes an aliphatic or alicyclic polyurethane resin, it is possible to prevent a phenomenon in which the optical properties of the antistatic layer are deteriorated, and it is possible to firmly bond each of the substrate and the cohesive layer.

Specifically, the aliphatic or alicyclic polyurethane resin may include a reaction product between an aliphatic polyisocyanate and a polyol.

In addition, the aliphatic or alicyclic polyurethane resin may contain a reaction product of a polyol (a), an aliphatic or alicyclic polyisocyanate compound (b), and a chain extender (c) including a diol compound or a diamine compound containing a hydrophilic functional group.

The aliphatic or alicyclic polyisocyanate compound refers to a compound that has a plurality of isocyanate groups including an aliphatic or alicyclic group, and can be represented by the formula $Q(NCO)_n$.

In this case, n is an integer of 2 to 4, and Q may be an aliphatic or alicyclic functional group containing 2 to 18 carbon atoms, preferably 6 to 10 carbon atoms.

Specific examples of such polyisocyanate compounds include ethylene diisocyanate, 1,4-tetramethylene diisocyanate, 1,6-hexamethylene diisocyanate (HDI), 1,12-dodecane diisocyanate, 1-isocyanato-3,3,5-trimethyl-5-isocyanatomethyl-cyclohexane, isophorone diisocyanate (IPDI), a mixture of two or more thereof, etc.

Various types of polyols may be used for the synthesis of the polyurethane resin. Specifically, the polyol may be a polyester polyol containing a reaction product between a polycarboxylic acid having 2 to 10 carbon atoms and a diol compound.

The diol compound that can be used in the synthesis of the polyester polyol may include ethylene glycol, 1,4-butane diol, diethylene glycol, or a mixture of two or more thereof.

The chain extender may further include at least one diol compound selected from the group consisting of ethylene glycol and 1,4-butanediol in addition to the above-mentioned diol compound or diamine compound containing the hydrophilic functional group.

Specific physical properties of the aliphatic or alicyclic polyurethane resin are not limited, but for example, the aliphatic or cycloaliphatic polyurethane resin may have a weight average molecular weight of 50,000 g/mol to 500,000 g/mol, and preferably 100,000 g/mol to 400,000 g/mol.

Further, the antistatic layer has an elongation of 90% or more, 90% to 600%, or 100% to 500%.

When elongation of the antistatic layer is less than 100% during the process of using the dicing die bonding film and during the stretching process, the antistatic layer itself cracks, which leads to the loss of the conductive path between the conductive polymers, and thus the function of the antistatic layer may be lost or a phenomenon of disappearance of the antistatic layer generated by being separated from the substrate may occur.

Meanwhile, the conductive filler may include organic conductive fillers or inorganic conductive fillers commonly known in the art. More specifically, the conductive filler may include at least one selected from the group consisting of polyaniline, polyacetylene, poly(para-phenylene), polythiophene, polypyrrole, polydienylene, polyphenylene vinylene, polyphenylene sulfide, polysulfur nitride, polyethylene 3,4-dioxythiophene-polystylenesulfonate (PEDOT-PSS), and poly(3,4-ethylenedioxythiophene).

The antistatic layer may include 5 to 100 parts by weight of the conductive filler based on 100 parts by weight of the aliphatic or alicyclic polyurethane resin.

When the content of the conductive filler is too small as compared with the aliphatic or alicyclic polyurethane resin, the surface resistance is increased due to a lack of the conductive material of the antistatic layer, and thus the antistatic property may not be exhibited.

When the content of the conductive filler is too high as compared with the aliphatic or alicyclic polyurethane resin, it is difficult to produce the antistatic layer having a uniform thickness and uniformly coated with a filler, the conductivity of the dicing tape may be deteriorated due to the conductive filler, and it may be difficult to sufficiently secure the pick-up property after dicing.

The antistatic layer may have a thickness of 0.05 μm to 5 μm.

When the thickness of the antistatic layer is too small, the surface resistance may be increased due to the lack of conductive material in the antistatic layer as described above, and thus the antistatic property may not be exhibited.

When the thickness of the antistatic layer is too large, it affects the physical properties of existing dicing tapes as the thickness of the antistatic layer becomes thick, and may cause deterioration of the existing processability and stretching characteristics.

Further, the antistatic layer may have surface resistance of $10^{11}$ Ω/sq or less, preferably $10^8$ Ω/sq or less.

If the surface resistance of the cohesive agent exceeds $10^{11}$ Ω/sq, the antistatic performance imparted to the dicing die-bonding film may be lowered.

In the present invention, the lower limit of the surface resistance of the cohesive agent is not particularly limited.

Meanwhile, a specific type of the substrate is not particularly limited as long as it is a commonly used polymer substrate film. For example, the substrate may include at least one polymer selected from the group consisting of a polyolefin, a polyester, a polycarbonate, a polyvinyl chloride, a polytetrafluoroethylene, a polybutene, a polybutadiene, a vinyl chloride copolymer, an ethylene-vinyl acetate copolymer, an ethylene-propylene copolymer, and an ethylene-alkyl acrylate copolymer.

The substrate film may have a thickness of 10 μm to 200 μm.

The specific composition of the cohesive layer is not particularly limited, and for example, the cohesive layer may include a cohesive resin, a photoinitiator, and a crosslinking agent.

The crosslinking agent may include at least one compound selected from the group consisting of an isocyanate-based compound, an aziridine-based compound, an epoxy-based compound, and a metal chelate-based compound.

The cohesive layer may include 0.1 to 40 parts by weight of a crosslinking agent based on 100 parts by weight of the adhesive resin.

If the content of the crosslinking agent is too small, the cohesive force of the cohesive layer may be insufficient, and if the content of the crosslinking agent is too high, the cohesive layer cannot sufficiently secure the cohesive force before photo-curing, and a chip scattering phenomenon or the like may occur.

Specific examples of the photoinitiator are not limited, and conventionally known photoinitiators may be used.

Further, the cohesive layer may include 0.1 to 20 parts by weight of a photoinitiator, based on 100 parts by weight of the cohesive resin.

Specifically, the cohesive resin may include a (meth)acrylate-based resin.

In the present invention, the (meth)acrylate is used with the meaning of including both acrylate and methacrylate.

The (meth)acrylate-based resin may be, for example, a copolymer of a (meth)acrylic acid ester-based monomer and a crosslinkable functional group-containing monomer.

In this case, examples of the (meth)acrylic acid ester-based monomer may include alkyl (meth)crylate. More specifically, as a monomer having an alkyl group having 1 to 12 carbon atoms, pentyl (meth)acrylate, n-butyl (meth)acrylate, ethyl (meth)acrylate, methyl (meth)acrylate, hexyl (meth)acrylate, n-octyl (meth)acrylate, isooctyl (meth)acrylate, 2-ethylhexyl (meth)acrylate, dodecyl (meth)acrylate, or decyl (meth)acrylate, and they may be used alone or in combination of two or more.

Examples of the crosslinkable functional group-containing monomer may include any one of a hydroxyl group-containing monomer, a carboxyl group-containing monomer, a nitrogen-containing monomer, and a mixture of two or more thereof.

Examples of the hydroxyl group-containing monomer may include 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl (meth)acrylate, 2-hydroxyethylene glycol (meth)acrylate, and 2-hydroxypropylene glycol (meth)acrylate.

Examples of the carboxyl group-containing compound may include (meth)acrylic acid, 2-(meth)acryloyloxy acetic acid, 3-(meth)acryloyloxy propyl acid, 4-(meth)acryloyloxy butyric acid, acrylic acid dimer, itaconic acid, maleic acid, maleic anhydride, or the like.

Examples of the nitrogen-containing monomer may include (meth)acrylonitrile, N-vinylpyrrolidone, N-vinylcaprolactam, or the like.

The (meth)acrylate-based resin may further include vinyl acetate, styrene, acrylonitrile, etc. from the viewpoint of improving other functionalities such as compatibility.

The cohesive layer may further include an ultraviolet curable compound.

The type of the ultraviolet curable compound is not particularly limited, and for example, a polyfunctional compound having a weight average molecular weight of about 500 to 300,000 (e.g., polyfunctional urethane acrylate, polyfunctional acrylate monomer or oligomer, etc.) can be used. An average person skilled in the art can easily select the appropriate compound according to the intended use.

The content of the ultraviolet curable compound may be 1 to 400 parts by weight, preferably 5 to 200 parts by weight, based on 100 parts by weight of the above-mentioned cohesive resin.

If the content of the ultraviolet curable compound is less than 1 part by weight, it is likely that the deterioration of the cohesive force after curing is not sufficient and the pick-up property is lowered. If it exceeds 400 parts by weight, it is likely that the cohesive force of the cohesive agent before ultraviolet irradiation is insufficient, or peeling of the release film or the like may not be easily performed.

The ultraviolet curable cohesive agent may be a compound in which a carbon-carbon double bond is bound to an end of a branched chain or a backbone of an acrylic copolymer as well as the additive ultraviolet-curing compound.

That is, the (meth)acrylic copolymer may further include an ultraviolet curable compound bonded to the side chain of the backbone containing the (meth)acrylic acid ester-based monomer and the crosslinkable functional group-containing monomer.

The type of the ultraviolet curable compound includes 1 to 5, preferably 1 or 2, photocurable functional groups (e.g., ultraviolet polymerizable carbon-carbon double bonds) per molecule, and is not particularly limited as long as it has a functional group capable of reacting with the crosslinkable functional group contained in the backbone. In this case, examples of the functional group capable of reacting with the crosslinkable functional group of the backbone include an isocyanate group and an epoxy group, but are not limited thereto.

Specific examples of the ultraviolet curable compound including functional groups capable of reacting with the hydroxy group included in the backbone may include (meth)acryloyloxy isocyanate, (meth)acryloyloxy methyl isocyanate, 2-(meth)acryloyloxy ethyl isocyanate, 3-(meth)acryloyloxy propyl isocyanate, 4-(meth)acryloyloxy butyl isocyanate, m-propenyl-α,α-dimethyl benzyl isocyanate, methacryloyl isocyanate, or allyl isocyanate; an acryloyl monoisocyanate compound obtained by reaction of a diisocyanate compound or a polyisocyanate compound with (meth)acrylic acid 2-hydroxyethyl; an acryloyl monoisocyanate compound obtained by reaction of a diisocyanate compound or a polyisocyanate compound; a polyol compound and (meth)acrylic acid 2-hydroxyethyl; or specific examples of the ultraviolet-curable compound including functional groups capable of reacting with the carboxyl group included in the backbone may include one or more of glycidyl(meth)acrylate, allyl glycidyl ether, and the like, but the present invention is not limited thereto.

The ultraviolet curable compound may be included in the backbone of the base resin by substituting from 5 mol % to 90 mol % of the crosslinkable functional group contained in the main chain.

If the substitution amount is less than 5 mol %, it is likely that the reduction of the peeling force by ultraviolet irradiation may not be sufficient, and if it exceeds 90 mol %, the cohesive force of the cohesive agent before ultraviolet irradiation may decrease.

The cohesive layer may appropriately include a tackifying agent such as a rosin resin, a terpene resin, a phenol resin, a styrene resin, an aliphatic petroleum resin, an aromatic petroleum resin, an aliphatic aromatic copolymer petroleum resin, or the like.

A method of forming the cohesive layer on the substrate film is not particularly limited, and for example, a method of directly applying a cohesive agent composition of the present invention onto the substrate film to form a cohesive layer, a method of applying the cohesive agent composition onto a delamination substrate to manufacture the cohesive layer and then transferring the cohesive layer on the substrate film using the delamination substrate, or the like, may be used.

A method of applying and drying the cohesive agent composition is not particularly limited, and for example, a method of applying a composition including each component itself or applying a composition including each component which is diluted in an appropriate organic solvent, by known methods such as a comma coater, a gravure coater, a die coater, a reverse coater, or the like, and then drying the solvent at a temperature of 60° C. to 200° C. for 10 seconds to 30 minutes, may be used.

In addition, in the above process, an aging process for sufficiently performing the crosslink reaction of the cohesive agent may be further performed.

The cohesive layer may have a thickness of 5 μm to 100 μm.

Meanwhile, the adhesive layer may include a thermoplastic resin, an epoxy resin, and a curing agent.

The thermoplastic resin may be at least one polymer resin selected from the group consisting of a polyimide, a polyetherimide, a polyester imide, a polyamide, a polyether sulfone, a polyether ketone, a polyolefin, a polyvinyl chloride, a phenoxy, a reactive butadiene acrylonitrile copolymer rubber, and a (meth)acrylate-based resin.

The epoxy resin may include epoxy resins for general adhesives known in the art, and for example, an epoxy resin containing two or more epoxy groups in the molecule and having a weight average molecular weight of 100 to 2000 can be used.

The epoxy resin forms a hard crosslinked structure through a curing process, and can exhibit excellent adhesiveness, heat resistance, and mechanical strength.

More specifically, it is preferable to use an epoxy resin having an average epoxy equivalent of 100 to 1000 as the epoxy resin.

If the epoxy equivalent of the epoxy resin is less than 100, the crosslinking density becomes excessively high, and it is likely that the adhesive film may exhibit overall rigid properties. If it exceeds 1000, it is likely that the heat resistance is lowered.

Examples of the epoxy resin may include a difunctional epoxy resin such as a bisphenol A epoxy resin or a bisphenol F epoxy resin; a polyfunctional epoxy resin having at least three functional groups such as cresol novolac epoxy resin, phenol novolac epoxy resin, tetrafunctional epoxy resin, a biphenyl type of epoxy resin, a triphenol methane type of epoxy resin, an alkyl-modified triphenol methane type of epoxy resin, a naphthalene type of epoxy resin, a dicyclopentadiene type of epoxy resin, a dicyclopentadiene-modified phenol type of epoxy resin, or the like, and they can used alone or in combination of two or more, but the present invention is not limited thereto.

Further, as the epoxy resin, it is preferable to use a mixed resin of a difunctional epoxy resin and a polyfunctional epoxy resin.

As used herein, the term "polyfunctional epoxy resin" means an epoxy resin having three or more functional groups.

That is, generally, the difunctional epoxy resin is excellent in flexibility and flowability at a high temperature, but its heat resistance and curing speed are deteriorated, whereas a polyfunctional epoxy resin having three or more functional groups exhibits excellent heat resistance due to a high curing rate and high crosslink density, but flexibility and flowability are lowered.

Therefore, it is possible to suppress scattering of chips and generation of burrs in the dicing step while controlling the elastic modulus and tack characteristics of the adhesive layer by properly mixing and using the two kinds of resins.

The curing agent contained in the adhesive layer is not particularly limited as long as it can react with the epoxy resin and/or the thermoplastic resin to form a cross-linked structure. For example, the curing agent may include at least one compound selected from the group consisting of a phenolic resin, an amine curing agent, and an acid anhydride curing agent.

The adhesive layer may include 10 to 1000 parts by weight of the thermoplastic resin and 10 to 700 parts by weight of the curing agent, based on 100 parts by weight of the epoxy resin.

The curing catalyst serves to accelerate the action of the curing agent or the curing of the resin composition for semiconductor adhesion, and a curing catalyst known to be used in the production of semiconductor adhesive films and the like can be used without particular limitation.

For example, as the curing catalyst, at least one selected from the group consisting of a phosphorus-based compound, a boron-based compound, a phosphorus-boron-based compound, and an imidazole-based compound may be used. The amount of the curing catalyst to be used can be appropriately selected in consideration of the physical properties and the like of the finally produced adhesive film, and for example, the curing catalyst may be use in an amount of 0.5 to 10 parts by weight based on 100 parts by weight of the total amount of the epoxy resin, the (meth)acrylate-based resin, and the phenol resin.

The adhesive layer may have a thickness of 1 μm to 300 μm.

The dicing die-bonding film may further include a release film formed on the adhesive layer.

Examples of the release film that may include a polyethylene terephthalate film, polytetrafluoroethylene films, a polyethylene film, a polypropylene film, a polybutene film, a polybutadiene film, a vinyl chloride copolymer film, a polyimide film, or the like. They can be used alone or in combination of two or more.

The surface of the release film as described above may be subjected to a release treatment with one or more kinds of treatments including alkyd-based, silicone-based, fluorine-based, unsaturated ester-based, polyolefin-based, wax-based, or the like. Among them, the treatments including alkyd-based, silicone-based, fluorine-based, or the like imparting heat resistance, are particularly preferred.

The release film may be commonly formed to a have a thickness of about 5 to 500 μm, preferably about 10 to 200 μm, but is not limited thereto.

The method for producing a dicing die-bonding film as described above is not particularly limited, and for example, a method of sequentially forming a cohesive part, an adhesive part, and a release film on a substrate, or a method of separately preparing a dicing film (substrate+cohesive part) and a die bonding film or a release film formed with an adhesive part and then laminating them, or the like can be used.

In this case, the substrate may be used in a state where an antistatic layer having elongation of 90% or more is formed on at least one surface thereof.

The lamination method is not particularly limited, and a hot roll lamination or a lamination press method can be used. Among them, the hot roll lamination method is preferable in terms of both continuous processability and efficiency.

The hot roll lamination method can be carried out at a temperature of 10° C. to 100° C. at a pressure of 0.1 Kgf/cm$^2$ to 10 Kgf/cm$^2$, but is not limited thereto.

According to another embodiment of the present invention, a dicing method of a semiconductor wafer using the dicing die-bonding film can be provided.

More specifically, another embodiment of the present invention may provide a dicing method of a semiconductor wafer including: partially pre-treating the semiconductor wafer including the dicing die-bonding film as described above and a wafer stacked on at least one surface of the dicing die-bonding film so that the semiconductor wafer is completely divided or is dividable; and irradiating ultraviolet rays on a substrate film of the pre-treated semiconductor wafer and picking up individual chips separated by the division of the semiconductor wafer.

The content of the dicing die bonding film includes all the contents described above.

In addition to the details of the procedures of the above dicing method, apparatuses, methods, and the like used in the dicing method of a semiconductor wafer, which are conventionally known in the art, can be used without particular limitation.

As the dicing die-bonding film is used, not only is there no influence on the existing semiconductor manufacturing process and the reliability defect caused by the static electricity can be solved through the provision of the antistatic performance, but also the yield of the final product can be improved, thereby solving the problems of defects due to the static electricity which may occur in the semiconductor packaging process.

ADVANTAGEOUS EFFECTS

According to the present invention, a dicing die-bonding film capable of not affecting the existing semiconductor manufacturing process and reliability preventing defects due to static electricity through the provision of the antistatic performance, and a dicing method of a semiconductor wafer using the dicing die-bonding film, can be provided.

According to the thinning of semiconductor wafers, there has been a problem that static electricity is generated during the dicing process or the manufacturing process of the package and thus the reliability of the semiconductor device was lowered. However, according to the above-mentioned dicing die-bonding film and dicing process method, generation of static electricity in the semiconductor device can be suppressed and the reliability of the semiconductor device can be improved, thereby preventing the occurrence of defects in the final product.

DETAILED DESCRIPTION OF THE EMBODIMENTS

Specific embodiments of the invention will be described in more detail in the following examples. However, the following examples are provided only to illustrate the embodiments of the invention, and the scope of the invention is not limited to the following examples.

PREPARATION EXAMPLE

Preparation Example 1: Preparation of (Meth)Acrylate-Based Resin

A mixture of monomers consisting of 68.5 parts by weight of 2-ethylhexyl acrylate (2-EHA), 8.5 parts by weight of methyl acrylate (MA), and 23 parts by weight of hydroxyethyl acrylate (HEA) were put into a reactor equipped with a cooling system so as to achieve reflux of a nitrogen gas and ease of temperature control according to compositions shown in Table 1 below.

Then, n-DDM at 400 ppm as a chain transfer agent (CTA) and 100 parts by weight of ethyl acetate (EAc) as a solvent based on 100 parts by weight of the monomer mixture were added thereto, and sufficiently mixed with each other at 30° C. for 30 minutes or more while injecting nitrogen in order to remove oxygen from the reactor.

Then, the temperature was increased to and maintained at 62° C., and V-60 (azobisisobutyronitrile) at 300 ppm as a reaction initiator was added thereto to thereby initiate the reaction, followed by polymerization for 6 hours, to prepare a primary reaction material.

24.6 parts by weight of 2-methacroyloxyethyl isocyanate (MOI) (80 mol % based on HEA in the primary reaction material) and 1 wt % of a catalyst (dibutyltin dilaurate: DBTDL) based on MOI were mixed in the primary reaction material, followed by reaction at 40° C. for 24 hours, to prepare a (meth)acrylate-based polymer resin in which an ultraviolet curing group was introduced into a branched chain of the polymer in the primary reaction material.

Preparation Example 2: Preparation of Polyurethane Resin

Adipic acid, ethylene glycol, and 1,4-butanediol were reacted in a molar ratio of 1:0.5:0.5 under the conditions of a temperature of 200° C., a reduced pressure of 500 to 760 mmHg, and a vacuum atmosphere to synthesize a polyester polyol.

Then, the synthesized polyester polyol, a chain extender [2,2'-(ethylenedioxy)bis(ethylamine)], and NMP were placed in a reactor in the presence of dibutyltin dilaurate, and the temperature was raised to 60° C.

1,4-cyclohexane diisocyanate was added to the reactor so that the ratio between the sum of the number of moles of hydroxyl groups contained in the polyester polyol and the chain extender and the number of moles of isocyanate of 1,4-cyclohexylmathane diisocyanate (CHDI) was 1:1. After raising the temperature to 80° C., a small amount of cyclohexane diisocyanate was further added thereto and polymerization was carried out.

Then, when polyurethane having a target viscosity and molecular weight was polymerized, methanol was added to react with an isocyanate group, and thereby a polyurethane resin was synthesized.

Preparation Example 3: Preparation of Polyurethane Resin

A polyurethane resin was synthesized in the same manner as in Preparation Example 2, except that the 1,4-cyclohexylmathane diisocyanate (CHDI) material was changed to hexamethylene diisocyanate (HDI).

Preparation Example 4: Preparation of Polyurethane Resin

A polyurethane resin was synthesized in the same manner as in Preparation Example 2, except that the 1,4-cyclohexylmathane diisocyanate (CHDI) material was changed to 2,4-toluene diisocyanate (TDI).

EXAMPLES AND COMPARATIVE EXAMPLES: MANUFACTURE OF DICING FILM, DIE-BONDING FILM, AND DICING DIE-BONDING FILM

Example 1

(1) Manufacture of Die-Bonding Film

A composition consisting of 90 g of a high molecular weight acrylic resin (Tg 20° C., weight average molecular weight of 850,000), 30 g of an epoxy resin (novolac epoxy resin, softening point of 94° C.), 20 g of a phenol resin as a curing agent for the epoxy resin (phenol novolac resin, softening point of 94° C.), 0.1 g of a medium temperature-initiation curing accelerator (2-methyl-imidazole), 0.5 g of a high temperature-initiation curing accelerator (2-phenyl-4-methyl imidazole), 20 g of a silica as a filler (average particle diameter of 75 nm), and methyl ethyl ketone were stirred and mixed with each other.

The mixed composition was applied to a substrate having a releasing force and dried at 110° C. for 3 minutes to manufacture a die-bonding film with a coating film thickness of 20 um.

(2) Manufacture of Antistatic Substrate

The polyurethane resin prepared in Preparation Example 2 and poly(3,4-ethylenedioxythiophene)-poly(styrenesulfonate) (content of 20 parts by weight based on 100 parts by weight of the polyurethane resin) were dissolved in a mixture of ethyl alcohol, distilled water, and methylpyrrolidone to prepare a coating solution (solid content: 3 wt %).

The coating solution was applied onto one side or both sides of a 100 μm polyolefin substrate and dried at 50° C. for 3 minutes to prepare an antistatic polyolefin substrate.

Further, it was applied onto PET having a thickness of 38 um to form an antistatic layer having a thickness of 5 μm.

Elongation of the antistatic layer was measured by a universal testing machine (UTM).

(3) Manufacture of Dicing Film 7 g of a TDI-based isocyanate curing agent and 3 g of a photoinitiator (Irgacure 184) were mixed with 100 g of (meth)acrylate-based polymer resin of Preparation Example 1 to prepare a cohesive agent composition.

The cohesive agent composition was applied to a release-treated PET having a thickness of 38 um and dried at 110° C. for 3 minutes to form a cohesive agent layer having a thickness of 10 um.

The formed cohesive agent layer was laminated on a polyolefin substrate film coated with the antistatic solution prepared in the above (2), followed by aging, to manufacture a dicing film.

(4) Manufacture of Dicing Die-Bonding Film

A die-bonding film which was cut in a circle was transferred on the manufactured dicing film by lamination under a condition of 5 kgf/cm² to manufacture a dicing die-bonding film.

Example 2

Dicing die-bonding films were manufactured in the same manner as in Example 1, except for using the urethane resin prepared in Preparation Example 3.

EXPERIMENTAL EXAMPLES

Physical properties of the dicing die-bonding films of the examples and comparative examples were evaluated by methods as described below, and results thereof are shown in Table 1 below.

1. Measurement of Elongation of Antistatic Layer

The antistatic layer having a thickness of 5 μm was prepared into a tensile test specimen with a size of 15 mm/50 mm in width/length, and then the upper part and the lower part were fixed to a jig of the universal testing machine. The tensile test was carried out at a rate of 100 mm/s.

In this case, after measuring the point at which the test specimen was cut, the elongation was calculated as follows.

Elongation (%)=[length after stretching/initial length]×100

2. Appearance after Stretching

The antistatic polyolefin substrate thus prepared was prepared into a tensile test specimen with a size of 15 mm/50 mm in width/length, and then the upper part and the lower part were fixed to the jig of the tensile tester. The sample was deformed by 100% in the longitudinal direction relative to the initial sample size. When the surface of the antistatic coating was observed, the surface of the antistatic layer was confirmed to be cracked.

Good: No cracks occurred on the antistatic layer surface
Poor: Cracks occurred on the antistatic layer surface 3. Adhesion to Substrate Film after Stretching The antistatic polyolefin substrate thus prepared was prepared into a tensile test specimen with a size of 100 mm/50 mm in width/length, and then the upper part and the lower part were fixed to the jig of the tensile tester. The sample was deformed by 100% in the longitudinal direction relative to the initial sample size. 11 cut lines were formed horizontally and laterally at 1 mm intervals into the antistatic coating film to make 100 divisions of 1 mm². The operation of attaching a cellophane tape thereon and peeling off the tape was repeated three times.

The results were classified and indicated as follows.
Good: No peeling of the antistatic layer
Insufficient: When the number of divisions of the peeled antistatic layer is 10 to 50
Poor: When the number of divisions of the peeled film is 50 to 100

4. Surface Resistance after Stretching

The antistatic polyolefin substrate thus prepared was prepared into a tensile test specimen with a size of 100 mm/50 mm in width/length, and then the upper part and the lower part were fixed to the jig of the tensile tester. The sample was deformed by 100% in the longitudinal direction relative to the initial sample size. The surface resistance value after applying a voltage of 100 volts for 10 seconds using a surface resistance meter (Hiresta, MCP-HT800) manufactured by Mitsubishi Chemical was measured.

TABLE 1

|  | Example 1 | Example 2 | Comparative Example 1 |
|---|---|---|---|
| Elongation of antistatic layer (%) | 100 | 400 | 80 |
| Appearance after stretching | Good | Good | Poor |
| Adhesion to substrate film after stretching | Good | Good | Insufficient |
| Surface resistance (Ω/sq) | $2.0 \times 10^8$ | $4.0 \times 10^7$ | $1.0 \times 10^{13}$ |

As can be seen from Table 1, it was confirmed that the dicing die bonding films of Examples 1 and 2 had no problem in appearance after stretching, and the adhesion to the substrate film after stretching was good.

On the other hand, it was confirmed that in the case of the dicing die-bonding film of Comparative Example 1, the appearance after stretching was poor and transmittance uniformity was reduced, and the antistatic layer was separated from the dicing die-bonding film, which caused a problem that the antistatic property was reduced.

The invention claimed is:

1. A dicing die-bonding film comprising: a substrate; an antistatic layer formed on the substrate and including an aliphatic or alicyclic polyurethane resin and a conductive filler; a cohesive layer formed on the antistatic layer; and an adhesive layer formed on the cohesive layer, wherein the antistatic layer has elongation of 90% or more and the aliphatic or alicyclic polyurethane resin includes a reaction product of an aliphatic or alicyclic polyisocyanate and a polyol.

2. The dicing die-bonding film according to claim 1, wherein
the antistatic layer has surface resistance of $10^{11}$ Ω/sq or less.

3. The dicing die-bonding film according to claim 1, wherein
the antistatic layer has a thickness of 0.05 μM to 5 μm.

4. The dicing die-bonding film according to claim 1, wherein
the antistatic layer includes 5 to 100 parts by weight of the conductive filler based on 100 parts by weight of the aliphatic or alicyclic polyurethane resin.

5. The dicing die-bonding film according to claim 1, wherein
the conductive filler includes at least one selected from the group consisting of polyaniline, polyacetylene, poly(para-phenylene), polythiophene, polypyrrole, polydienylene, polyphenylene vinylene, polyphenylene sulfide, polysulfur nitride, polyethylene 3,4-dioxythiophene-polystylenesulfonate (PEDOT-PSS), and poly(3,4-ethylenedioxythiophene).

6. The dicing die-bonding film according to claim 1, wherein
the substrate includes at least one polymer selected from the group consisting of a polyolefin, a polyester, a polycarbonate, a polyvinyl chloride, a polytetrafluoroethylene, a polybutene, a polybutadiene, a vinyl chloride copolymer, an ethylene-vinyl acetate copolymer, an ethylene-propylene copolymer, and an ethylene-alkyl acrylate copolymer.

7. The dicing die-bonding film according to claim 1, wherein
   the cohesive layer includes a cohesive resin, a photoinitiator, and a crosslinking agent, and
   the adhesive layer includes a thermoplastic resin, an epoxy resin, and a curing agent.

8. The dicing die-bonding film according to claim 1, wherein
   the substrate film has a thickness of 10 μM to 200 μm,
   the cohesive layer has a thickness of 5 μM to 100 μm, and
   the adhesive layer has a thickness of 1 μM to 300 μm.

\* \* \* \* \*